(12) United States Patent
Efantis

(10) Patent No.: US 6,909,289 B2
(45) Date of Patent: Jun. 21, 2005

(54) ELECTRICAL HIGH TENSION TESTER

(75) Inventor: Antonios Efantis, Don Mills (CA)

(73) Assignee: Allanson International Inc., Toronto (CA)

( * ) Notice: Subject to any disclaimer, the term of this patent is extended or adjusted under 35 U.S.C. 154(b) by 95 days.

(21) Appl. No.: 10/401,831

(22) Filed: Mar. 31, 2003

(65) Prior Publication Data
US 2004/0189320 A1 Sep. 30, 2004

(51) Int. Cl.[7] .......................... H01H 9/50; G01R 31/02
(52) U.S. Cl. ..................... 324/536; 324/72.5
(58) Field of Search .................. 324/536, 512, 324/500, 388, 402, 464, 393, 396, 390, 754, 515, 556, 72.5; 439/42, 52, 72, 78, 146, 246; 123/630

(56) References Cited

U.S. PATENT DOCUMENTS

| | | | | |
|---|---|---|---|---|
| 3,676,776 A | * | 7/1972 | Bauer et al. ............... | 324/72.5 |
| 4,326,167 A | * | 4/1982 | Fehr et al. ................. | 324/415 |
| 4,445,084 A | * | 4/1984 | Washington ............... | 324/556 |
| 5,196,798 A | * | 3/1993 | Baeza et al. ............... | 324/388 |
| 5,418,461 A | * | 5/1995 | Maeda et al. .............. | 324/393 |
| 5,427,541 A | * | 6/1995 | Calio ......................... | 439/246 |
| 5,461,316 A | * | 10/1995 | Maruyama et al. ........ | 324/402 |
| 6,009,744 A | * | 1/2000 | Kovalchick et al. ....... | 73/40 |
| 6,019,612 A | * | 2/2000 | Hasegawa et al. ......... | 439/73 |
| 6,136,461 A | * | 10/2000 | DeCrosta, Jr. ............. | 429/11 |

* cited by examiner

Primary Examiner—Anjan Deb
Assistant Examiner—Hoai-An D. Nguyen
(74) Attorney, Agent, or Firm—Eugene J. A. Gierczak

(57) ABSTRACT

An electrical high tension test device having first and second contacts connectable to a high tension circuit, a first electrode connected to one contact; a second electrode connected to the second contact, the first and second electrodes being spaced apart from one another by an air gap defining a predetermined resistance preset to a resistance corresponding to the high tension voltage in the high tension circuit to be tested, and, a signal device responsive to high tension discharge across said air gap to generate a signal such that when a predetermined high tension voltage is applied to the first and second contacts, a spark will jump the gap between them and in this way activating the signal device, and when a high tension voltage is applied which is less than the predetermined voltage no spark will jump the gap, and no signal will be generated.

11 Claims, 4 Drawing Sheets

ELECTRICAL HIGH TENSION TESTER

FIELD OF THE INVENTION

The invention relates to a tester for testing an electrical high tension circuit. In particular, the tester provides a small low cost portable unit which may be used for testing the high tension circuits in locations such as oil furnace burners, typically on a domestic service call.

BACKGROUND OF THE INVENTION

Malfunctions of domestic oil furnaces are a cause of frequent service calls. Such service calls must be made with some urgency since when the furnace in the home is not working there is no heat. There is a danger of pipes freezing, and even a danger to health in some cases.

Furnaces can malfunction for a variety of reasons. The ignition system for igniting the oil generally uses an ignition transformer or electronic ignitor. One such type of ignition system includes a pair of ignitor electrodes. A high tension spark is generated at the ignitor electrodes to ignite the oil. If the spark is not present, the furnace will not operate. An ignition transformer or electronic ignitor is often used to generate the high tension required for the spark. Such ignition transformers or electronic ignitors are known to fail and require replacement.

Thus on each such service call the service man will generally first of all test the spark to determine if the spark is adequate. If it is satisfactory then the transformer is working and he knows he must look elsewhere for the problem. If the spark is not present or is too weak, it is not satisfactory. He will then usually replace the transformer which generates the high tension for the spark.

Testing the output of a coil or transformer has often been done in a haphazard manner. For example, testing of a coil in the ignition circuit of an automobile, which frequently has problems caused by coil failure, was generally done by simply shorting the two high tension terminals on the coil with a screw driver. If there was a spark the coil was in order. It was not unusual for the mechanic to be injured by this test, but it was regularly done. This testing method was often used in domestic furnaces. However, in this case the coil terminals were located inside a housing in the burner. To test them the cover must first of all be removed. The high tension voltage in the furnace burner is much higher than was used in the ignition of automobiles, and the danger of shock was much greater.

The test was also inaccurate. The coil may give a spark when tested in this way, but the spark may not be sufficient to jump the electrodes in the burner. The serviceman will thus be misled by the result.

There are numerous other situations where it is required to test a coil or transformer, in cases other than a domestic furnace. In all these cases, the ability to perform a safe quick accurate test will greatly speed up the work of the technicians involved. While tests can be carried out with sophisticated devices costing considerable sums, these devices are not usually available at the location where the test is being carried out. They are not usually portable, or of sufficiently low cost that they can be supplied to every serviceman and technician in every situation.

There is a need for a simple, low cost, light weight, high tension tester, which can be part of the tool kit of every serviceman and technician, and can readily be carried about from place to place, wherever it is required.

BRIEF SUMMARY OF THE INVENTION

The invention seeks to provide the foregoing features and advantages by the provision of an electrical high tension test device having a first lead and a second contact connectable in circuit with a source of high tension, a first electrode connected to one contact, a second electrode connected to the second contact, the first and second electrodes being spaced apart from one another by an air gap, to create a predetermined resistance in the circuit, the resistance being preset to correspond to the high tension circuit to be tested, and a signal device responsive to discharge across said air gap in said circuit to generate a signal, whereby when a predetermined high tension voltage is applied to said first and second contacts, a spark will jump the air gap between said first and second electrodes, thereby activating said signal device, and when a high tension voltage is applied to said first and second contacts which is less than said predetermined voltage no spark will jump the air gap, and no signal will be generated.

The invention further provides an electrical tester as described, wherein the two contacts are generally convex shaped surfaces adapted to be manually held in contact with portions of a high tension circuit.

The invention further provides an electrical tester as described, wherein the electrodes are spheres, and including a capacitance and a signal device contained in a box-like housing, and wherein said contacts are located on the exterior of said housing.

The invention further provides an electrical tester as described, wherein the signal device is an LED (Light-Emitting Diode) lamp, and wherein said lamp is visible from the exterior of said housing.

The invention provides, in one embodiment, a pair of generally spherical contacts on the exterior of the housing, the contacts being dimensioned and located so as to make contact with the ignitor electrodes in an ignition transformer or electronic ignitor used to ignite oil in a furnace.

The novel features of the present invention, which are considered as characteristic for the invention, are set forth in the appended claims. The invention itself, however, both as to its construction and its mode of operation, together with additional advantages and objects thereof, will be best understood from the following detailed description of preferred embodiments, when read with reference to the accompanying drawings.

IN THE DRAWINGS

DESCRIPTION OF A SPECIFIC EMBODIMENT

Figure 1:
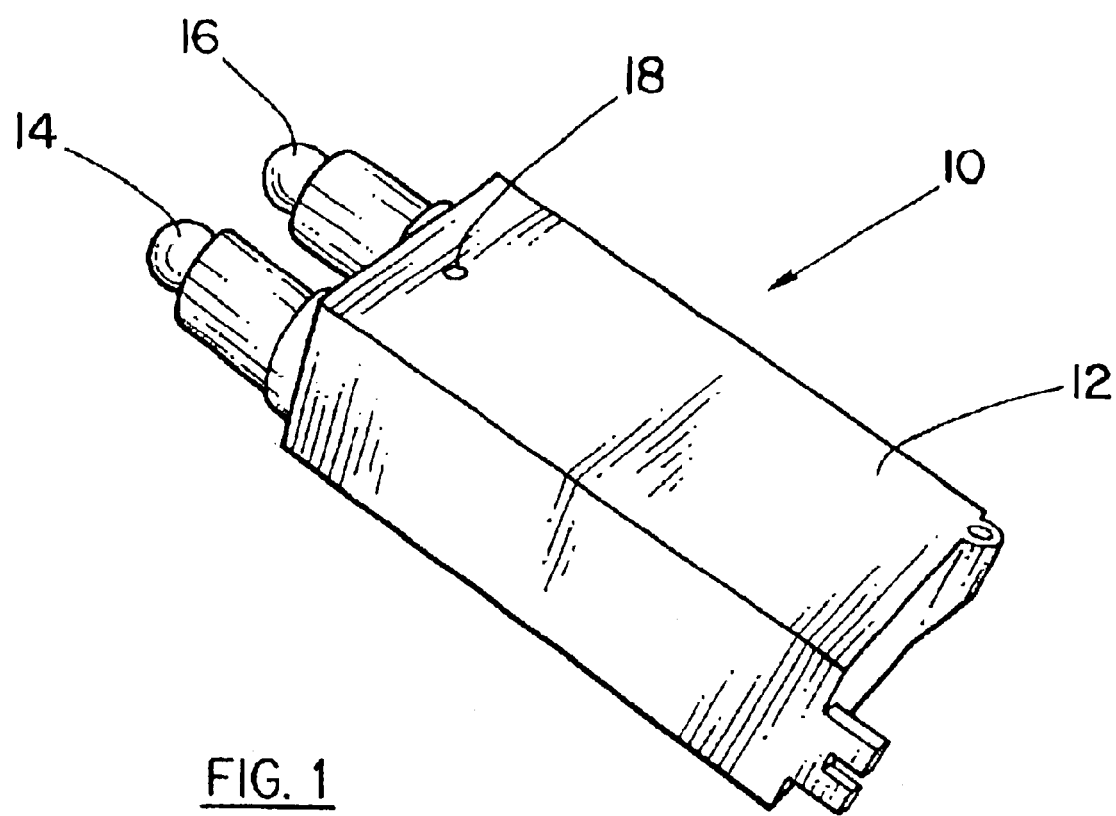
FIG. 1 is a perspective of the electrical tester illustrating the invention.

Referring to FIG. 1, it will be seen that this shows a circuit tester indicated generally as tester 10. Tester 10 has a rectangular box like housing 12 which contains the circuits to be described below.

In this embodiment, two conductors 14 and 16 extend from housing 12 for connection to a high tension circuit (not shown). In an embodiment of the invention, the conductors 14 and 16 are of spherical shape, and are secured in predetermined spaced locations on the exterior of housing 12. A visual indicator 18 is mounted on housing 12, for giving a visual indication of the operation of the circuit being tested.

Figure 2:
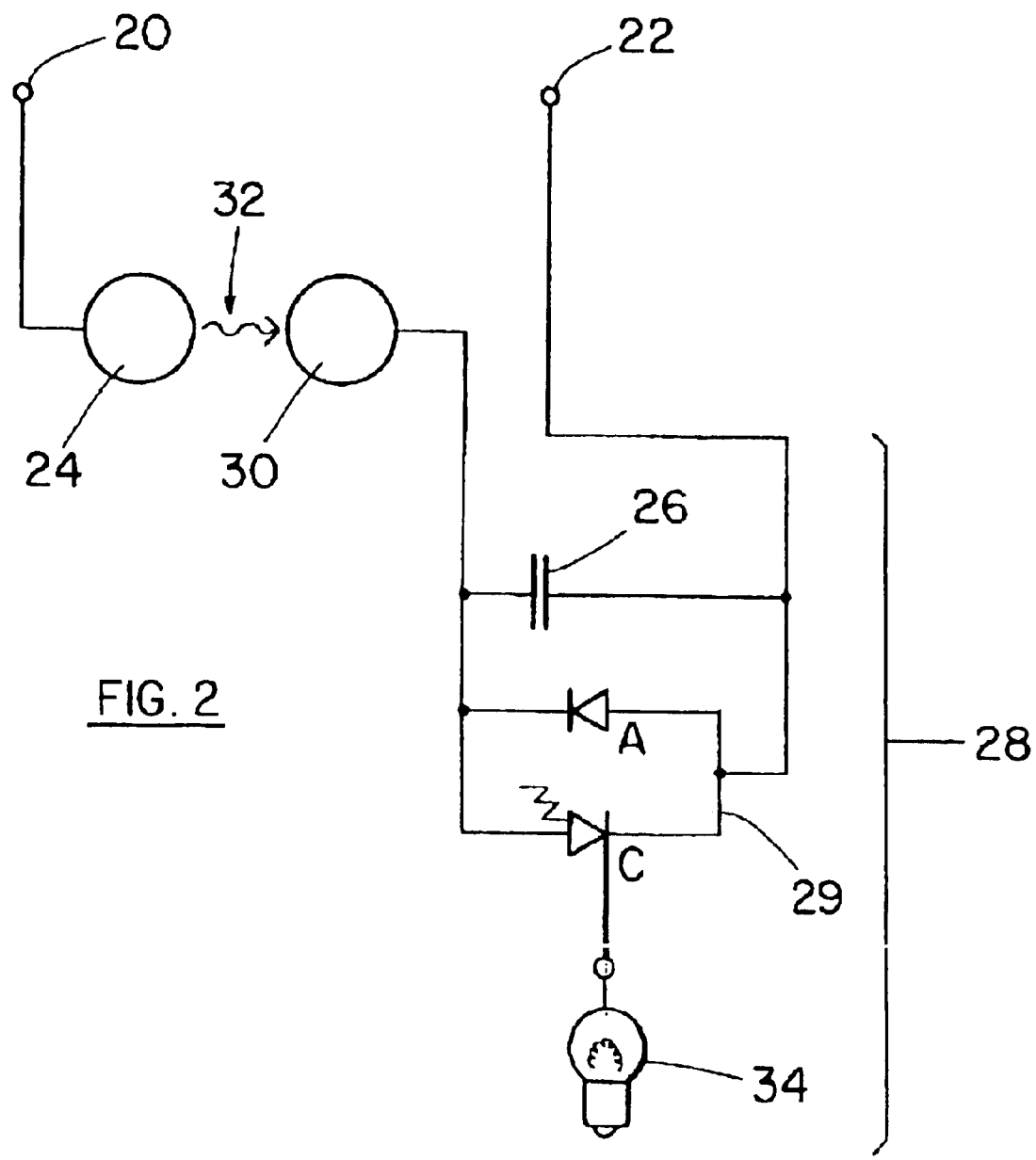
FIG. 2 is a block diagram of the circuit.

Within housing 12, there are components of a circuit as illustrated generally in FIG. 2.

The circuit and its operation are designed for a specific application, where the desired voltage of the high tension circuit are predetermined.

However, some components could be replaced with components of different values for other specific applications in which the high tension voltages are of different values. In a further embodiment, a component with a specific value corresponding to a specific high tension voltage may possibly be replaced with a component having a value which can be adjusted. This would make the unit adaptable to testing various different types of high tension circuits, having different high tension voltage parameters. It is also possible that whereas in the illustrated embodiment the two interior electrodes (described below) are located a fixed distance apart, in another embodiment the spacing between the interior electrodes could be adjustable, so as to create a greater or a lesser air gap.

Figure 3:
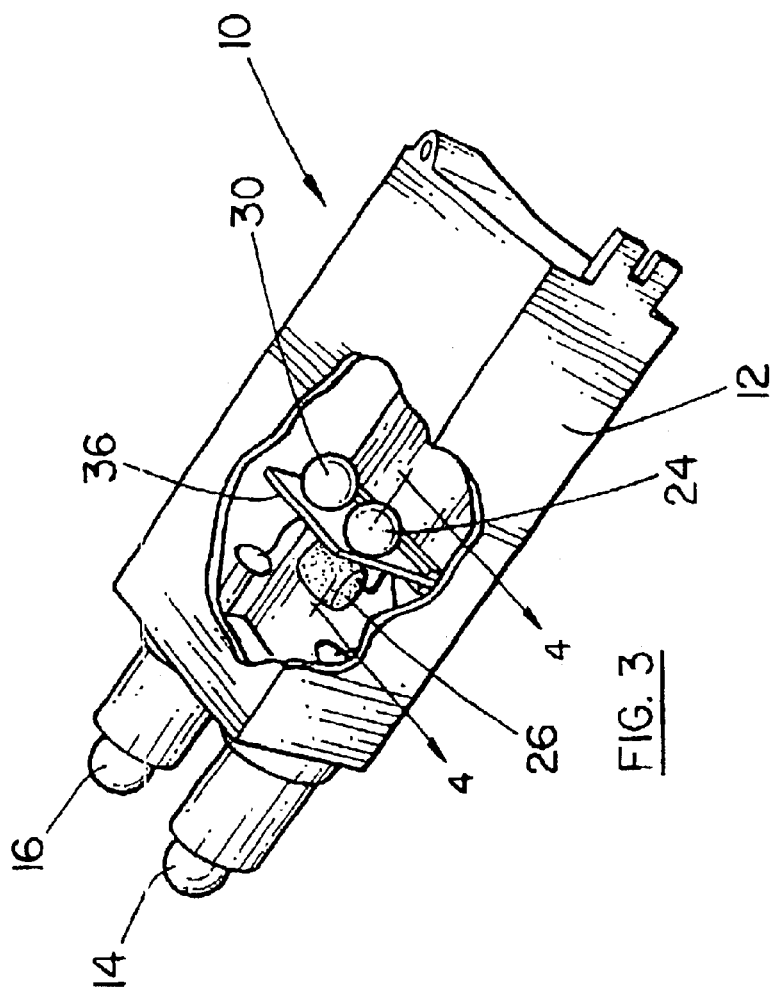
FIG. 3 is a perspective of an alternate embodiment, partly cut away.

Thus as shown in FIG. 2, the circuit comprises internal leads 20 and 22. In this embodiment, these internal leads 20 and 22 are connected to respective exterior conductors 14 and 16, as illustrated in FIG. 3. In this embodiment, lead 20 is connected to electrode 24. Lead 22 is connected to LED circuit 28 and electrode 30. In this embodiment, the LED circuit 28 includes a capacitor 26 and LED 29, as best illustrated in FIG. 2. The LED 29 is connected to an LED lamp 34.

The two electrodes 24 and 30 are spaced apart as at 32 to define an air gap therebetween of predetermined width. The air gap establishes a break in the circuit which will require a certain predetermined voltage before a discharge can occur from one electrode to the other. The LED circuit 28 is connected to a visual indicator device, in this case an LED lamp 34.

In operation the two conductors 14 and 16 are connected to two locations in a high tension circuit (not shown).

The high tension circuit is then activated so as to generate a high tension voltage.

If the voltage is correct the high tension will cause a discharge from electrode 24 to electrode 30 across the air gap 32. It will then pass into capacitor 26 and cause activation of the visual indicator device or LED lamp 34. Capacitor 26 acts as a coupler between the LED circuit 28 and electrode 24. The visual indicator device or LED lamp 34 enables the visual indicator 18 illustrated in FIG. 1 to indicate to the operator that the high tension circuit is operating correctly.

Activation of the visual indicator device or LED lamp 34 enables the operator to then know that the high tension circuit is operating correctly. He will then check other components to determine the cause of the malfunction.

If the voltage is too low, below the predetermined voltage required to produce a discharge across from electrode 24 to electrode 30, the visual indicator device 34 does not activate. The operator will know that the high tension voltage is either not present or is inadequate. He will then replace high tension components, typically a coil or transformer (not shown), and test the circuit again.

Figure 4:
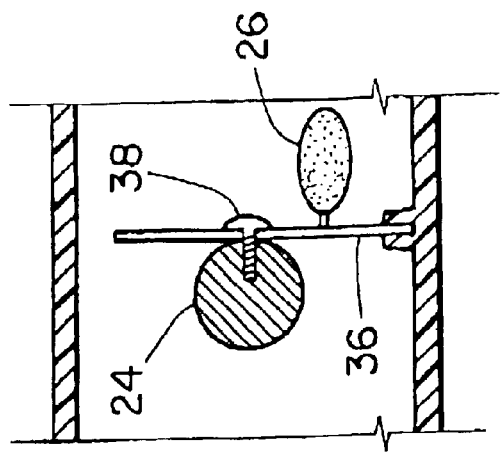
FIG. 4 is a section along line 4—4 of FIG. 3.

The electrodes 24 and 30 are solid spherical members, as illustrated in FIGS. 3 and 4, preferably formed of metallic conductive material, typically being of brass. Each electrode is mounted on a circuit board indicated generally as 36 in FIG. 3.

The actual mounting can be by means of threaded bolts 38 passing through the circuit board 36 and into threaded recesses in the electrodes. This is illustrated in specific form in FIG. 4.

A specific embodiment is shown in FIGS. 1, 3 and 4. This is designed for using in testing the high tension circuits in ignition transformer or electronic ignitors used to ignite oil in furnaces.

Figure 5:
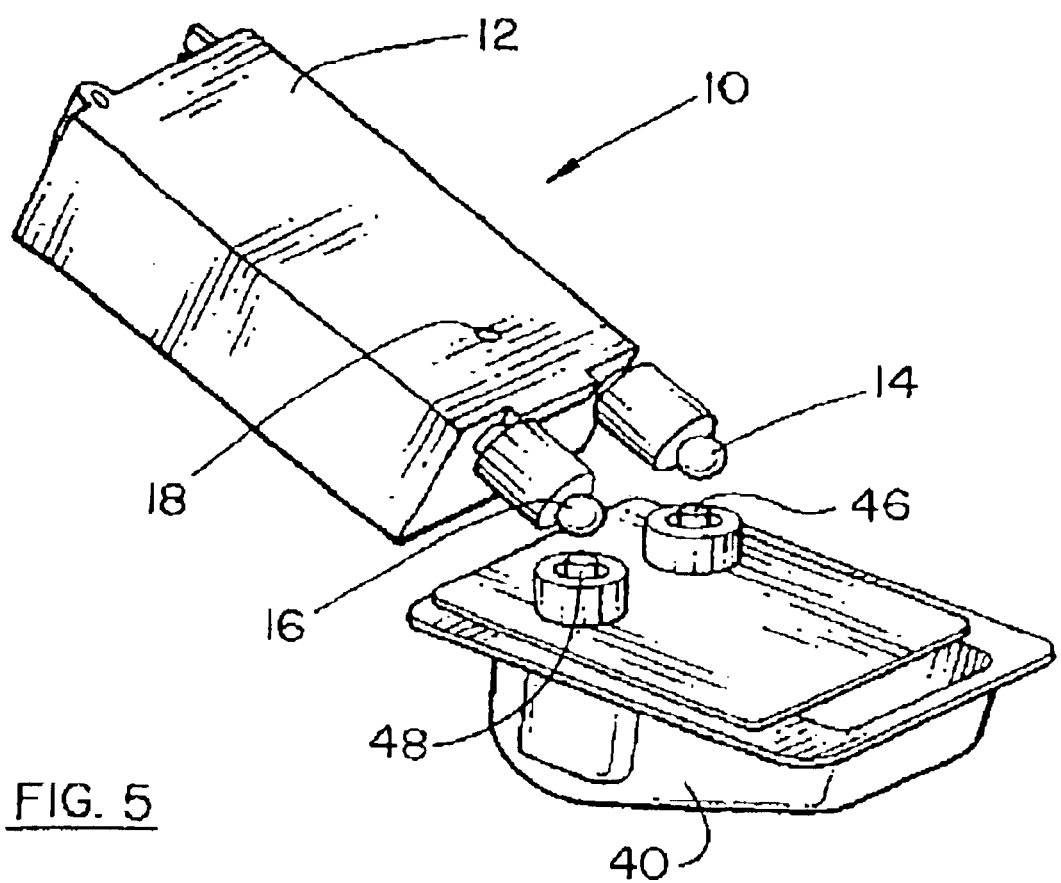
FIG. 5 is a perspective of an ignition transformer or electronic ignitor for igniting oil in a furnace illustrating the use of one embodiment of the invention.

One such electronic ignitor or ignition transformer is shown in FIG. 5. The electronic ignitor or ignition transformer generally consists of a housing 40 and a burner tube (not shown). Air is blown in and oil is injected into the airstream in a known manner. The oil/air mixture is ignited in burner tube. Ignition is effected by electrical discharge between ignitor electrodes 46 and 48. The ignitor electrodes 46 and 48 are connected to a high tension circuit generally in the region of 10–14 kVs. The two ignitor electrodes 46 and 48 are spaced apart at a distance defining an air gap. This spaced apart distance generally corresponds with the spaced apart distance between the conductors 14 and 16. The high tension voltage is designed to create a discharge across that air gap, and thus produce sparks which will ignite the oil/air mix.

The tester 10 of FIGS. 1 and 3 has a housing 12 which contains a circuit as shown in FIG. 2, and includes the visual indicator 18 as in FIG. 1.

When a service person wishes to test the high tension circuit he will simply open the top of the housing 40 of the oil burner, and expose the two ignitor electrodes 46 and 48.

He will then simply position the two contact bodies 14 and 16, of the tester 10, so that they touch the two electrodes 46 and 48. He will then operate the burner. If the high tension is adequate, it will cause the visual indicator (not shown in FIG. 4) to indicate a discharge, in this case by a flash. If there is no indication he will then replace the transformer.

The foregoing is a description of specific embodiments of the invention. It is given here by way of example only.

The components of the present invention are preferably selected from existing off-the-shelf components and assembled to form the circuit described herein in a manner that is known. For example, for testing a high tension circuit in the 10–14 kV range an air gap 32 of 3 to 4 mm was found to be operative. A known LED circuit 28 was used in sequence with a known capacitor having a capacitance of approximately 0.1 uF.

The invention is not to be taken as restricted to any specific feature described but comprehends all such variations as come with the spirit and scope of the following claims.

I claim:

1. An electrical tester for testing the high tension in a high tension circuit, having a predetermined high tension voltage parameter and comprising:

first and second contacts disposed in a fixed spaced apart relationship with one another, and being connectable to said high tension circuit;

a first electrode connected to one contact;

a second electrode connected to the second contact, the first and second electrodes being spaced apart from one another by an air gap and defining a predetermined width, wherein a resistance is preset to a resistance corresponding to the voltage in said high tension circuit to be tested; and a signal device responsive to high tension discharge across said air gap to generate a signal, whereby when said predetermined high tension voltage is applied to said first and second contacts, a spark will jump the gap between said first and second electrodes, thereby activating said signal device, and when a high tension voltage is applied which is less than said predetermined high tension voltage no spark will jump the gap, and no signal will be generated.

2. An electrical tester as claimed in claim 1, wherein the two contacts are conductors adapted to be brought into contact with portions of said high tension circuit.

3. An electrical tester as claimed in claim 1, wherein the two contacts are generally convex shaped surfaces adapted to be held in contact with portions of said high tension circuit.

4. An electrical tester as claimed in claim 1, wherein the electrodes are spheres, and including a capacitance and a visual indicator device contained in a box-like housing, and wherein said contacts are located exterior of said housing.

5. An electrical tester as claimed in claim 1, wherein the signal device is a visual indicator device and wherein said visual indicator device is visible front the exterior of said housing.

6. An electrical tester as claimed in claim 5, wherein said visual indicator device is an LED lamp.

7. An electrical tester as claimed in claim 1, wherein said contacts are spherical bodies mounted on the exterior of said housing, said bodies being located spaced apart a predetermined distance corresponding the spacing between two portions of a high tension circuit to be tested.

8. An electrical tester as claimed in claim 1, wherein the high tension circuit is included in an oil burner ignitor for an oil furnace, said ignitor having two ignitor electrodes defining an air gap for electrical discharge of high tension voltage for creating a spark, and wherein said bodies are spaced apart a distance such that they can be placed in contact with said ignitor electrodes.

9. An electrical tester as claimed in claim 1, the electrical tester further comprising a housing, and the first and second contacts being mounted on the housing in a fixed spaced apart relationship at a predetermined distance from one another.

10. An electrical tester as claimed in claim 9, wherein the predetermined distance corresponds substantially to the space between two electrodes connected to the high tension circuit.

11. An electrical tester as claimed in claim 10, wherein the first and second contacts include a spherical portion rigidly mounted on the housing, such spherical portion being disposed so as to be connectable with electrodes having different shapes, dimensions and/or locations on the transformer.

* * * * *